(12) United States Patent
Frosien et al.

(10) Patent No.: US 8,026,492 B2
(45) Date of Patent: Sep. 27, 2011

(54) DUAL MODE GAS FIELD ION SOURCE

(75) Inventors: Juergen Frosien, Riemerling (DE); Dieter Winkler, Munich (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 253 days.

(21) Appl. No.: 12/264,859

(22) Filed: Nov. 4, 2008

(65) Prior Publication Data

US 2010/0108902 A1 May 6, 2010

(51) Int. Cl.
*H01J 27/02* (2006.01)
(52) U.S. Cl. .............. 250/396 R; 250/423 R; 250/423 F
(58) Field of Classification Search ............... 250/396 R
See application file for complete search history.

(56) References Cited

U.S. PATENT DOCUMENTS

| 4,638,209 | A | | 1/1987 | Asamaki et al. | |
| 5,055,696 | A | * | 10/1991 | Haraichi et al. | 250/492.2 |
| 7,112,804 | B2 | * | 9/2006 | Horsky et al. | 250/423 R |
| 7,851,768 | B2 | * | 12/2010 | Frosien | 250/423 F |
| 2007/0194226 | A1 | * | 8/2007 | Ward et al. | 250/309 |
| 2007/0215802 | A1 | | 9/2007 | Ward et al. | |

FOREIGN PATENT DOCUMENTS

EP 1936653 A1 6/2008

OTHER PUBLICATIONS

Extended European Search Report mailed Sep. 8, 2009 in EP 08168304.
Jouston K et al.; "Current-voltage characteristics of a gas field ion source"; Applied Physics, B, vol. 46, No. 4, pp. 313-323, 1988 (XP009116653).
Ochiai Y et al.; "Fluorine gas field ion source"; Microprocess 89. Proceedings of the 1989 International Symposium on Microprocess Conference; Jul. 2-5, 1989; Kobe, Japan, pp. 298-302, 1989 (XP009115916).
Kuo Hong-Shi et al.; "Gas field ion source from an Ir/W<111> single-atom tip"; Applied Physics Letters, American Institute of Physics, Melville, NY, vol. 92, No. 6, pp. 63106-1-63106-3, Feb. 13, 2008 (XP012108214).
Hong-Shi Kuo et al., "Gas field ion source from an Ir/W<111> single-atom tip," Applied Physics Letters, 2008 vol. 92: pp. 063106-1-063106-3.

* cited by examiner

*Primary Examiner* — Phillip A Johnston
(74) *Attorney, Agent, or Firm* — Patterson & Sheridan, L.L.P.

(57) ABSTRACT

A focused ion beam device is provided, including: an ion beam column adapted to house a gas field ion source emitter with an emitter tip and an emitter area for generating ions, a heating means adapted to heat the emitter tip, one or more gas inlets adapted to introduce a first gas and at least one second gas to the emitter area, an objective lens adapted to focus the ion beam generated from the first gas or the second gas, and a controller adapted to switch between a first emitter tip temperature and a second emitter tip temperature for generating an ion beam of ions of the first gas or an ion beam of ions of the at least one second gas.

24 Claims, 7 Drawing Sheets

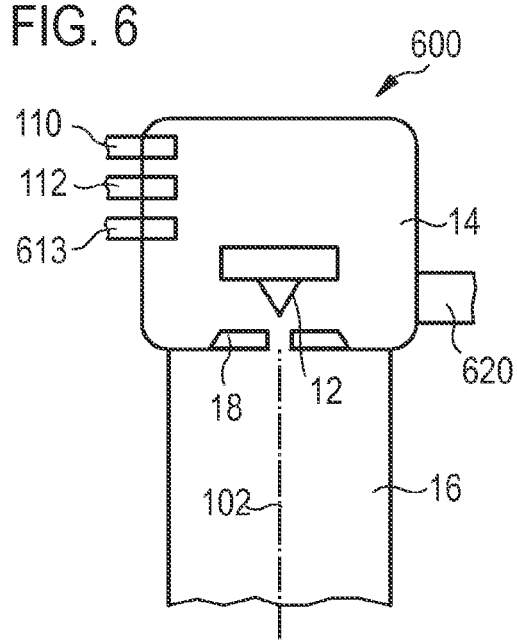
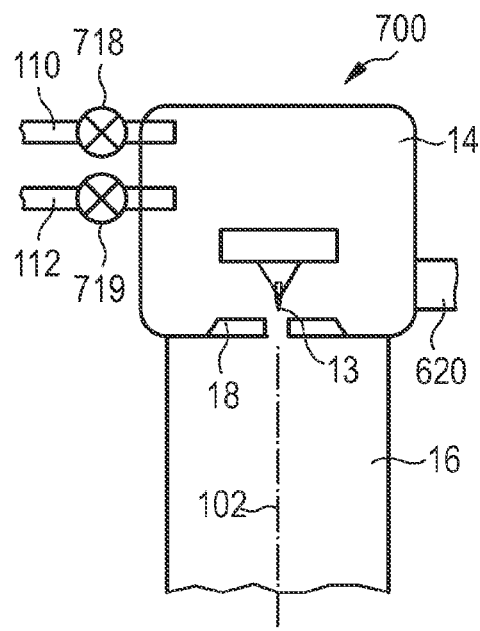
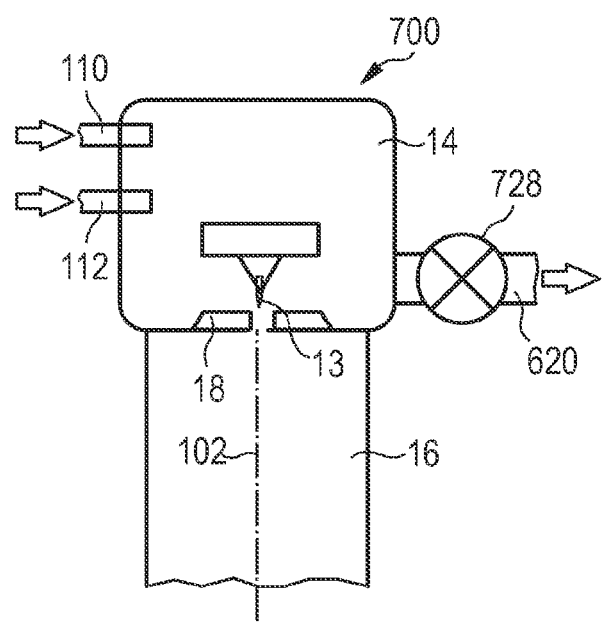

DUAL MODE GAS FIELD ION SOURCE

FIELD OF THE INVENTION

The invention relates to a charged particle beam device and a method of operating a charged particle beam device. Particularly, it relates to a focused ion beam device having a gas field ion source, in particular for imaging, inspecting and structuring a specimen. Further, it relates to a gas field ion source column for dual mode operation and a method of operating a gas field ion source with different modes of operation. More specifically, it relates to a focused ion beam device and a method of operating a focused ion beam device.

BACKGROUND OF THE INVENTION

Technologies such as microelectronics, micromechanics and biotechnology have created a high demand for structuring and probing specimens within the nanometer scale. Micrometer and nanometer scale process control, inspection or structuring, is often done with charged particle beams. Probing or structuring is often performed with charged particle beams which are generated and focused in charged particle beam devices. Examples of charged particle beam devices are electron microscopes, electron beam pattern generators, ion microscopes as well as ion beam pattern generators. Charged particle beams, in particular ion beams, offer superior spatial resolution compared to photon beams, due to their short wave lengths at comparable particle energy.

During manufacturing of semiconductor devices or the like, a plurality of observation steps and sample modification steps are usually conducted. Common systems include an electron beam column for observation, imaging, testing or inspecting of a specimen and an ion beam column for patterning of a specimen or material modification. These "dual beam" systems have a high complexity and are, thus, expensive.

SUMMARY

In light of the above, the present invention provides a focused ion beam device according to independent claim 1, a method of operating a focused ion beam device according to independent claim 10, a method of operating a focused ion beam device according to independent claim 15, and a focused ion beam device according to independent claim 17.

According to one embodiment, a focused ion beam device is provided. The focused ion beam device includes an ion beam column adapted to house a gas field ion source emitter with an emitter tip and an emitter area for generating ions; a heating means adapted to heat the emitter tip; one or more gas inlets adapted to introduce a first gas and at least one second gas to the emitter area; and a controller adapted to switch between a first emitter tip temperature and at least a second emitter tip temperature for generating an ion beam of ions of the first gas or an ion beam of ions of the at least one second gas.

According to another embodiment, a method of operating a focused ion beam device is provided, the method including: biasing an emitter with an emitter tip within an emitter area wherein ions are generated to a potential for providing an extraction voltage for emitting an ion beam of at least one gas of a first gas and at least one second gas; heating to a first emitter tip temperature to emit an ion beam of the first gas; and heating to at least one second emitter tip temperature to emit at least one ion beam of the at least one second gas.

According to a further embodiment, a focused ion beam device is provided, including: an ion beam column housing an emitter with an emitter tip and an emitter area for generating ions of a first gas and at least one second gas; and means for switching between a first emitter tip temperature and at least one second emitter tip temperature, wherein the first gas is selected from the group consisting of hydrogen and helium and the at least one second gas has an atomic mass of 10 g/mol or higher.

According to a yet further embodiment, a method of operating a focused ion beam device is provided, wherein at least two different ion beams of a first gas and at least one second gas are consecutively generated by switching between at least two different emitter tip temperatures, the emitter tip temperatures each providing ionization of at least one of the gases.

Further advantages, features, aspects and details that can be combined with embodiments described herein are evident from the depending claims, the description and the drawings.

Embodiments are also directed to apparatuses for carrying out the disclosed methods and including apparatus parts for performing each described method step. These method steps may be performed by way of hardware components, a computer programmed by appropriate software, by any combination of the two or in any other manner. Furthermore, embodiments according to the invention are also directed to methods by which the described apparatus operates. It includes method steps for carrying out every function of the apparatus.

BRIEF DESCRIPTION OF THE DRAWINGS

So that the manner in which the above-recited features of the present invention can be understood in detail, a more particular description of the invention, briefly summarized above, may be had by reference to embodiments. The accompanying drawings relate to embodiments of the invention and are described in the following:

FIG. 6 shows a schematic view of parts of a charged particle beam device in the form of a focused ion beam device with a first gas inlet, a second gas inlet and a third gas inlet according to embodiments described herein;

FIG. 7A shows a schematic view of parts of a charged particle beam device in the form of a focused ion beam device with gas inlets and valves according to embodiments described herein;

FIG. 7B shows a schematic view of parts of a charged particle beam device in the form of a focused ion beam device with gas inlets and valves according to embodiments described herein;

DETAILED DESCRIPTION OF THE INVENTION

Figure 1A:
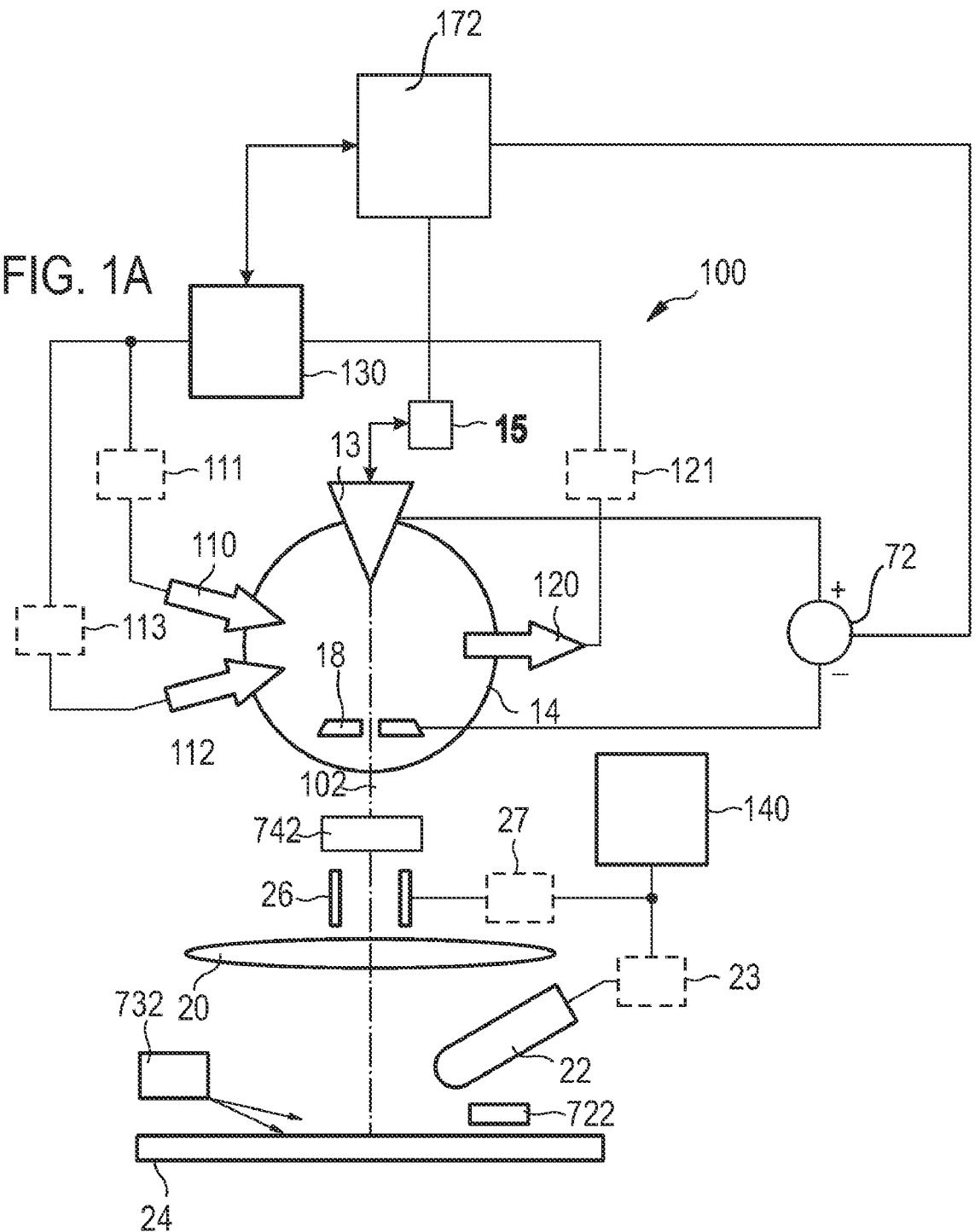
FIG. 1A shows a schematic view of parts of a charged particle beam device in the form of a focused ion beam device with a first gas inlet, a second gas inlet and a heater according to embodiments described herein.

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Without limiting the scope of protection of the present application, in the following the charged particle beam device or components thereof will exemplarily be referred to as a charged particle beam device including the detection of secondary electrons. The present invention can still be applied for apparatuses and components detecting corpuscles such as secondary and/or backscattered charged particles in the form of electrons or ions, photons, X-rays or other signals in order to obtain a specimen image.

Generally, when referring to corpuscles it is to be understood as a light signal, in which the corpuscles are photons, as well as particles, in which the corpuscles are ions, atoms, electrons or other particles.

Within the following description of the drawings, the same reference numbers refer to the same components. Generally, only the differences with respect to the individual embodiments are described.

A "specimen" as referred to herein, includes, but is not limited to, semiconductor wafers, semiconductor workpieces, and other workpieces such as memory disks and the like. Embodiments of the invention may be applied to any workpiece on which material is deposited or which is structured. A specimen includes a surface to be structured or on which layers are deposited, an edge, and typically a bevel.

According to embodiments described herein, a single column charged particle beam device is provided, which allows for a high-resolution imaging and sample modification. Thereby, a simplified single column operation can be provided. Further, in light of the fact that one column can be omitted, a reduction of costs can be achieved.

Generally, focused ion beam devices can, for example, be based on liquid-metal ion sources or gas ion sources. Ions in gas ion sources can be produced by bombardment of electrons, atoms or ions with gas atoms or molecules or by exposing gas atoms or molecules to high electric fields or irradiation. Thereby, noble gas ion sources have been found to be potential candidates for focused ion beam (FIB) applications.

Sources based on the field ionization process are known as gas field ion sources (GFIS). An ionization process takes place at high electric fields or extraction voltages, respectively, larger than $10^{10}$ V/m. The field may, for example, be applied between an emitter tip and a biased extraction aperture, which are for instance provided in a gun chamber which may in one example include an enclosure in which the emitter tip is provided.

The emitter tip is biased to a positive potential with respect to a downstream extraction aperture, whereby an electric field strong enough to ionize the gas atoms in the vicinity of the tip of the emitter unit is generated. The area in the vicinity of the emitter, wherein the desired electric field is provided or, more generally, wherein the generation of ions is conducted, may be referred to as an emitter area. Gas pressures of $10^{-6}$ mbar to $10^{-2}$ mbar are desirable near the tip of the emitter unit. Thereby, as explained in more detail below, a gas gradient is typically used in order to, on the one hand, provide a sufficient amount of gas atoms or molecules in the emitter area and, on the other hand, to not disturb emitted ions by gas molecules provided in the gun chamber.

Figure 1B:
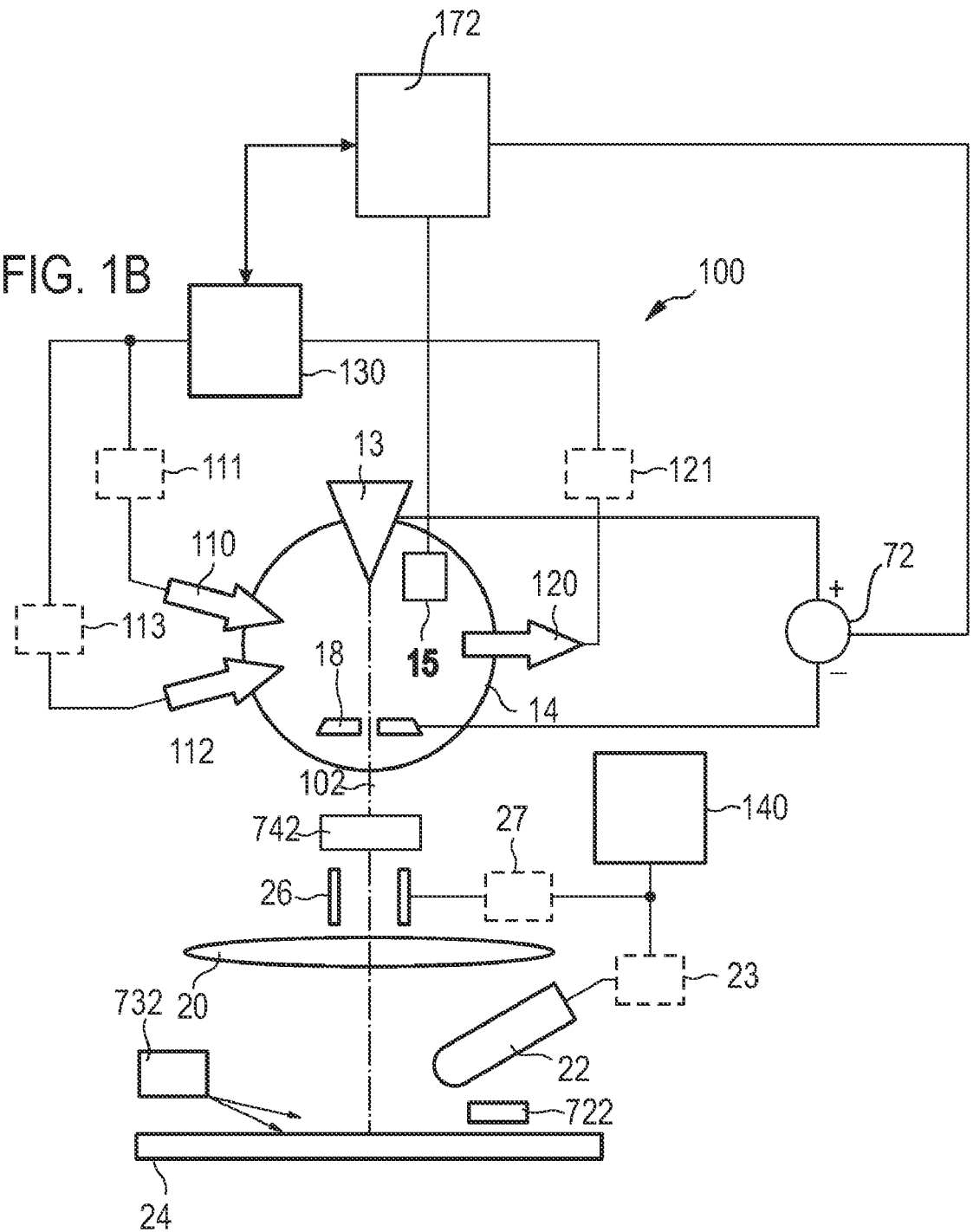
FIG. 1B shows a schematic view of parts of a charged particle beam device in the form of a focused ion beam device with a first gas inlet, a second gas inlet and a heater according to embodiments described herein.

FIGS. 1A and 1B show a first gas inlet 110 and a second gas inlet 112. According to embodiments described herein, different modes of operation can be provided. According to one operational mode, a light gas, e.g., a gas having an atomic mass of less than 10 g/mol, such as hydrogen or helium, is introduced into the chamber/enclosure 14 through one of the first and the second gas inlets, and an ion beam of the ionized light gas can be generated. The light gas ions can be used for an observation or imaging without damaging the specimen.

According to another operational mode, a different gas, which is a heavier gas as, for example, argon, neon, xenon or krypton is introduced into the chamber/enclosure 14 through one of the first or second gas inlets 110 or 112. The ion beam of the ionized heavy gas, which is generated within the gun chamber, that is the enclosure 14, is similar to an ion beam of a standard focused ion beam column for sputtering material. The heavy gas beam can, thus, be used for material modification, or to produce cuts or trenches within a specimen, or to get depth information.

Within the embodiments described herein, the enclosure 14, in which the emitter 12 including the emitter tip 14 is provided, may be a part of the ion beam column. Alternatively, it may be a separate chamber included in the ion beam column. Moreover, the enclosure 14 may correspond to the emitter area. Further, it is possible that the ion beam column itself provides the enclosure, wherein the emitter is located and wherein the gases are introduced.

The light gas ions do not sputter the sample material and can be used for imaging, testing, observation, or the like. Thereby, a light gas ion may have an even better resolution than an electron beam because of the shorter wavelengths of the ion beam as compared to an electron beam Generally, as shown in FIGS. 1A and 1B, a focused ion beam device 100 can schematically be illustrated as follows. An enclosure 14 with a biased gas field ion source emitter tip 13 is provided. Further, a first (light) gas inlet 110 and a second (heavy) gas inlet 112 is provided. Thereby, the first gas and the second gas are provided into the enclosure 14 towards the emitter tip 13 and to the emitter area in the vicinity of the emitter. In the vicinity of the emitter, tip the desired excitation conditions are provided. According to different embodiments, which can be combined with other embodiments described herein, the two gas inlets can be provided in the form of two nozzles, gas channels, or other gas inlet means.

According to other embodiments, the two gas inlets provide the two gases in a common nozzle, gas channel, or other gas inlet means.

As shown in FIGS. 1A and 1B, a gas outlet 120 is provided. The gas outlet 120 can be connected to a vacuum pump, a further vacuum chamber, or other means to support the evacuation and/or the control of the pressure in the enclosure 14. Thereby, the process parameters for ion beam generation can be controlled.

Typically, a gas pressure gradient within the gun chamber can be provided. Thereby, the gas pressure is higher in the vicinity of the emitter, and the emitter tip and is reduced towards an extraction electrode. Thereby, a sufficient amount of gas can be provided to the emitter tip, and the amount of gas that may disturb the ion emission is reduced. According to different examples, which can be combined with any of the embodiments described herein, the gas pressure gradient may reach from $10^{-5}$ mbar to $10^{-3}$ mbar, typically from $10^{-4}$ mbar to $5 \times 10^{-3}$ mbar. Behind the extractor, the gas pressure decreases further.

As shown in FIGS. 1A and 1B, according to some embodiments described herein, a controller 130 can be provided. The controller 130 controls the supply of light gas into the enclosure 14 and the supply of heavy gas in the enclosure 14. Further, for embodiments including a separate gas outlet 120, the controller may control the gas outlet, a vacuum system, vacuum pumps or valves corresponding therewith. According to further embodiments, controllers 111, 113 and 121 can be provided. These controllers are controllers for the individual inlets, outlets, valves, pumps and the like. As indicated by the dashed lines, these controllers may be omitted as they are redundant in cases where the controller 130 is able to control the components directly.

The ion beam is focused by the lens 20 on the specimen 24. According to one embodiment, lens 20 is an electrostatic lens. Depending on the application, one or more optical elements like lenses, deflectors, Wien filters, condensers, alignment units, collimators, acceleration or deceleration units, apertures etc. could be additionally arranged in the focused ion beam device.

Generally, the ion beam is deflected with a scan deflector 26 to raster scan the ion beam over the specimen 24 or position the ion beam at the position of the specimen. Secondary and/or backscatter particles, for example secondary and/or secondary electrons, are detected with detector 22, particularly when the focused ion beam device is operated in an observation mode.

According to further embodiments, as shown in FIGS. 1A and 1B, a controller 140 can be provided. Controller 140 controls the scan deflector 26 and the detector 22. During the observation mode of the focused ion beam device 100, the device works similar to a scanning electron microscope. The ion beam with a diameter of a few nanometers or less (e.g., 1 nm or less) is scanned over the specimen 24, e.g., raster scanned in a pattern over the specimen 24, vector-scanned, or interlaced scanned. Secondary and/or backscattered electrons or other corpuscles can be detected with a detector. A time resolved signal is generated, and the controller 140 allows for correlating a signal at a given instance of time with a corresponding deflection value. Thereby, the raster pattern can be assembled to an image by correlating the signals with respect to the position on the specimen 24.

A dual mode gas ion column could, on the one hand, be provided by supplying different gases, that is, for example a light gas and a heavy gas, in the enclosure 14 and switching between the two modes of operation by supplying different gases for each of the operational modes. According to embodiments described herein, which can individually be combined with details of the individual examples, instead of supplying the different species of gas by switching between the different gas supplies, the gas field ion gun may contain a mixture of the required gases. According to examples of embodiments, the selection of different ion species can be conducted based on different tip temperatures. According to some examples of embodiments, the selection of different ion species can further be conducted based on different ionization energies.

In light of the above, according to embodiments, which may be combined with any other embodiment disclosed herein, as a heating means a heater 15 is provided for heating the emitter tip 13.

As illustrated in FIG. 1A, the heater 15 may be connected to the emitter tip 13 for heating. In one example of embodiments, which can be combined with any other example or embodiment disclosed herein, the emitter tip 13 is provided at a filament of a support including the filament and a filament base. In this case, the heater 15 may be adapted to heat at least one element selected from the group consisting of the emitter tip, the filament and the filament base. For instance, the heater 15 may be a resistance heater. In one example, the heater 15 may include a heating current supply, e.g., of about 10 V, having one port connected to one end of the filament and a second port connected to the other end of the filament. In another example, the heater 15 may be connected to the filament base and may heat the emitter tip via the filament base and the filament. As a result, a front part of the emitter tip support, i.e., the part adjacent to the emitter tip, is heated, thereby heating the emitter tip, while cooling of a rear part of the emitter tip support, i.e., the part between the front part and a cooling unit (not shown), is continued. The cooling unit will be described below.

In another example of embodiments, which can be combined with any other example or embodiment disclosed herein, the heater 15 is positioned adjacent to the emitter tip. In this case, the heater 15 may not be connected to the emitter tip. For instance, the heater 15 may be positioned in an emitter tip region, e.g., in the enclosure 14, adjacent to the emitter tip, as shown in FIG. 1B. In such a case, the heater 15 may e.g., be at least one element selected from the group consisting of an electromagnetic heater, an induction heater, a radiant heater, an IR heater, a particle source (e.g., an electron source), and a laser. As a result, the emitter tip may be heated while cooling of the front part and/or the rear part of the emitter tip support is continued.

Hence, according to embodiments described herein, a rapid switching between an operation of cooling the emitter tip and an operation of heating the emitter tip may be achieved.

Further, according to some embodiments described herein, an adjustable power supply 72 is provided for supplying an extraction voltage between the emitter tip 13 and the electrode 18. The extraction voltage can be controlled by a controller 172 as will be described in more detail below. Further, the controller may optionally also control the controller 130 for controlling the partial pressures of the gases.

Figure 2:
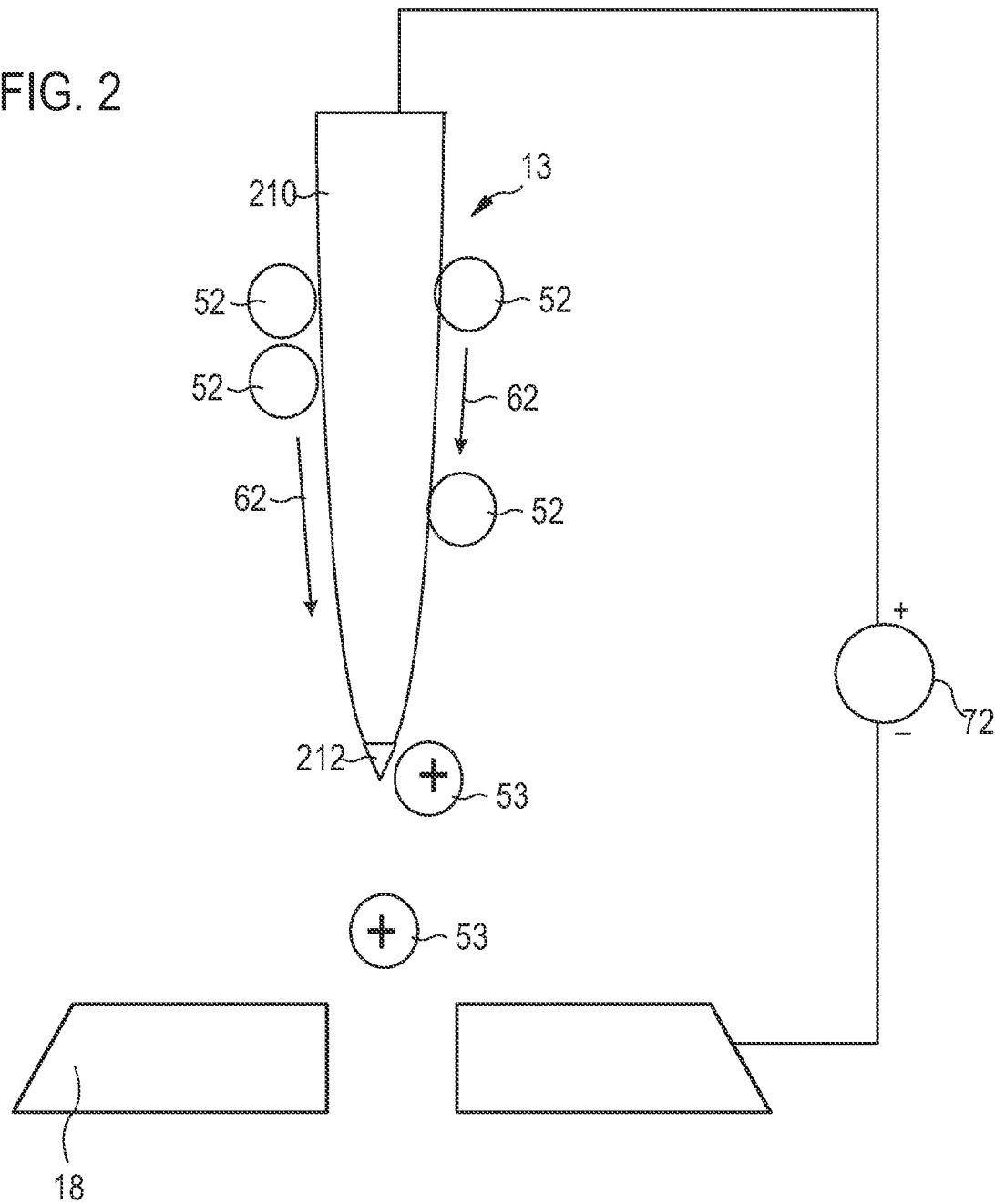
FIG. 2 shows a schematic view of an emitter tip in a gas field ion source and the principle of operation of the emitter tip according to embodiments described herein.

FIG. 2 shows an emitter tip 13 and an extraction electrode 18. Between the emitter tip and the extraction electrode, a voltage supply 72 is provided for generating a high electric field. Typically, the emitter tip 13 includes a shank 210 and a tip 212, which may include in one example a supertip. According to different embodiments, the tip 212, which is provided at the shank 210 can be a tip including one, two, three, four, five atoms or more. The operation principle of the ion generation of a gas field ion source is explained with respect to one species. As shown in FIG. 2, for example helium atoms 52 which are ionized to generate helium ions 53 are provided.

The emitter tip 13 can typically be in communication with a cooling unit (not shown). According to different embodiments, which can be combined with any of the embodiments described herein, the cooling unit can include any of the following systems: the cooling unit may be a cryocooler, EG, open or closed cycle-coolers, open or closed cycle helium coolers, open or closed cycle nitro tin coolers, a combination thereof or another cooler. Particular examples can be a pulse tube cooler or GM cooler (Gifford McMahon cooler).

If helium gas is provided to the emitter tip along a direction in FIG. 2 from top to bottom, the helium atoms 52 condense at the shank 210 of the emitter 13. Thereby, it is typically desired to have a shank 210 which provides a sufficiently large surface for condensation of the helium atoms. The surface can be in a range typically from 0.2 $\mu m^2$ to 5 $\mu m^2$.

As indicated by arrows 62 the atoms diffuse towards the tip 212. Thereby, movement based on diffusion due to different helium concentration at the shank 212 with respect to the tip 212 and based on drifts due to the electric field can result in a movement of the helium atoms 52 towards the tip 212. As an example, helium typically requires an electrical field of approximately 44 V/nm for ionization. The voltage between the emitter tip 13 and the extraction electrode 18 is chosen such that the electric field at the tip 212 provides at least the ionization energy for the species to be ionized. Thereby, it has to be considered that the electric field at the tip with its small dimensions is higher than at any other point of the emitter. Helium atoms 52 are thus ionized at the tip 212 and are emitted as helium ions 53.

Figure 3A:
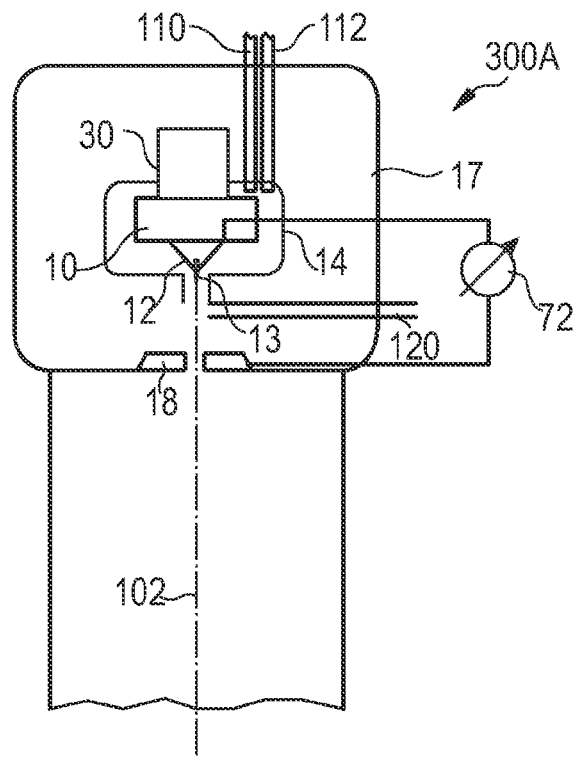
FIG. 3A shows a schematic view of parts of a charged particle beam device in the form of a focused ion beam device with a first gas inlet and a second gas inlet according to embodiments described herein.
Figure 3B:
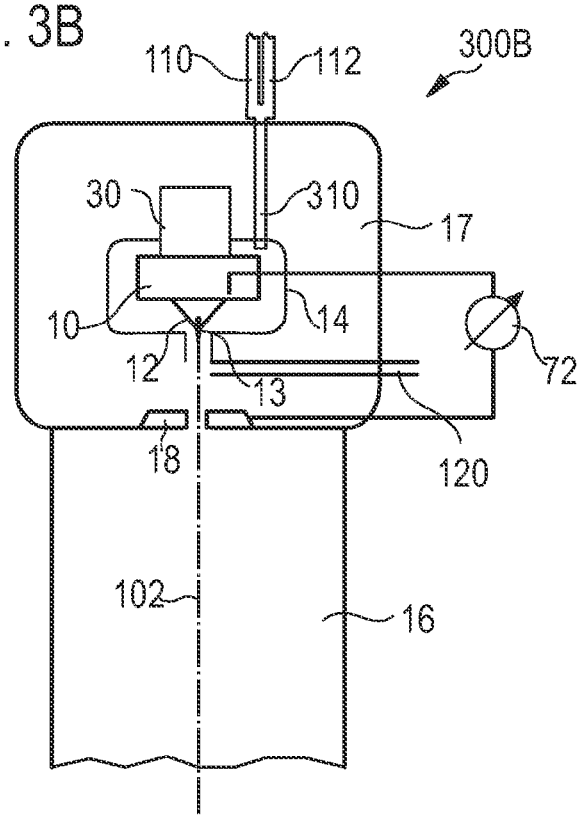
FIG. 3B shows a schematic view of parts of a charged particle beam device in the form of a focused ion beam device with a first gas inlet, a second gas inlet, and a common gas inlet according to embodiments described herein.

FIGS. 3A and 3B illustrate further embodiments of a portion of focused ion beam columns 300a and 300b, respectively. Therein, a gun chamber 17 is provided on top of the column 16. The emitter 12 is mounted to an emitter holder 10. A cooling unit 30 is provided to have thermal conductivity between the cooling unit 30 and the emitter tip 13 via the emitter holder 10. An extraction electrode 18 is provided for the voltage between the emitter tip 13 and the extraction electrode. Connections from the emitter to the extraction electrode are connected via a voltage supply 72, which is able to provide different voltages. Further, as shown in FIG. 3A a first gas inlet 110 and a second gas inlet 112 provide a first and a second gas, respectively, to the enclosure such that a gas mixture is provided to the emitter. According to some embodiments described herein, the emitter 12 including the emitter tip 13 may be provided within an enclosure 14, and the enclosure 14 may be shaped such that the gas is provided to the emitter 13 from top to bottom in order to provide a sufficiently large condensation surface at the shank of the emitter tip. A gas outlet 120 can be included in order to evacuate and/or control the pressure in the enclosure 14. The ions generated in the vicinity of the emitter tip 13 are accelerated towards the extraction electrode and are guided along optical access 102.

As shown in FIG. 3B, according to some embodiments it is possible that the first gas inlet and the second gas inlet provide the gas to a common gas inlet 310, which supplies the gas mixture into the emitter area. According to embodiments described herein, the gas mixture can be either provided to the vicinity of the emitter tip by having two separate gas inlets, having two separate gas inlets feeding the respective gases into a common gas inlet, or by supplying a gas mixture through a single gas inlet.

According to yet further embodiments, more than two gases and, thus, more than two gas inlets can be provided for feeding gases or a common gas inlet. Further, it is possible, that a mixture of more than two gases, for example three or four gases, can be directly fed into the emitter area.

Figure 4:
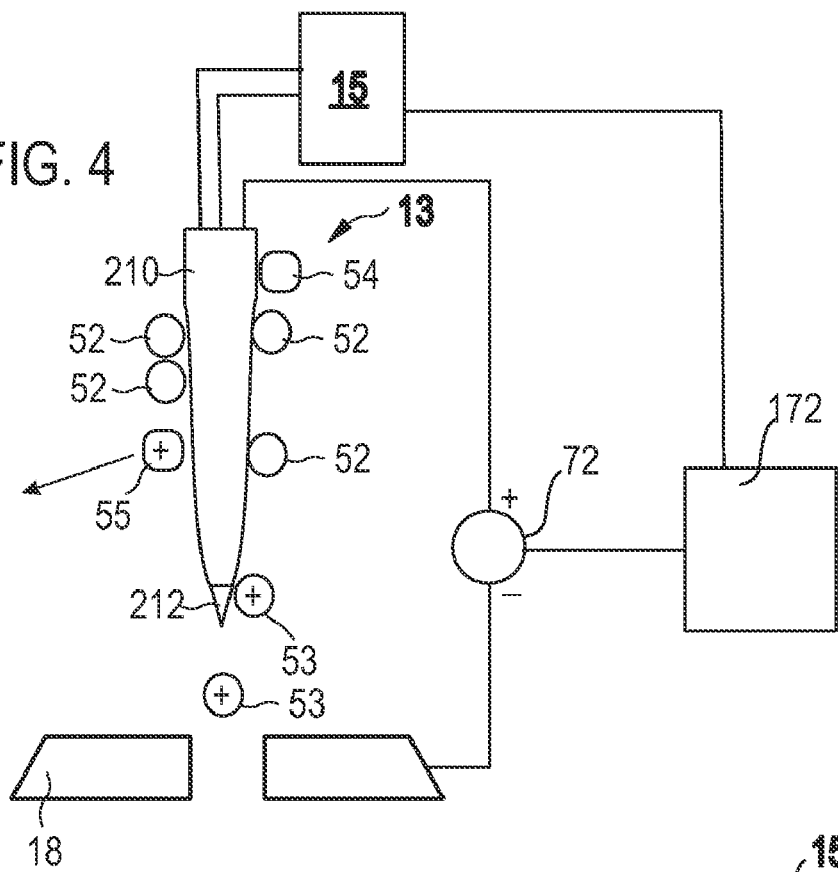
FIG. 4 shows a schematic view of an emitter tip in a gas field ion source and the principle of operation of the emitter tip in a first mode of operation according to embodiments described herein.
Figure 5:
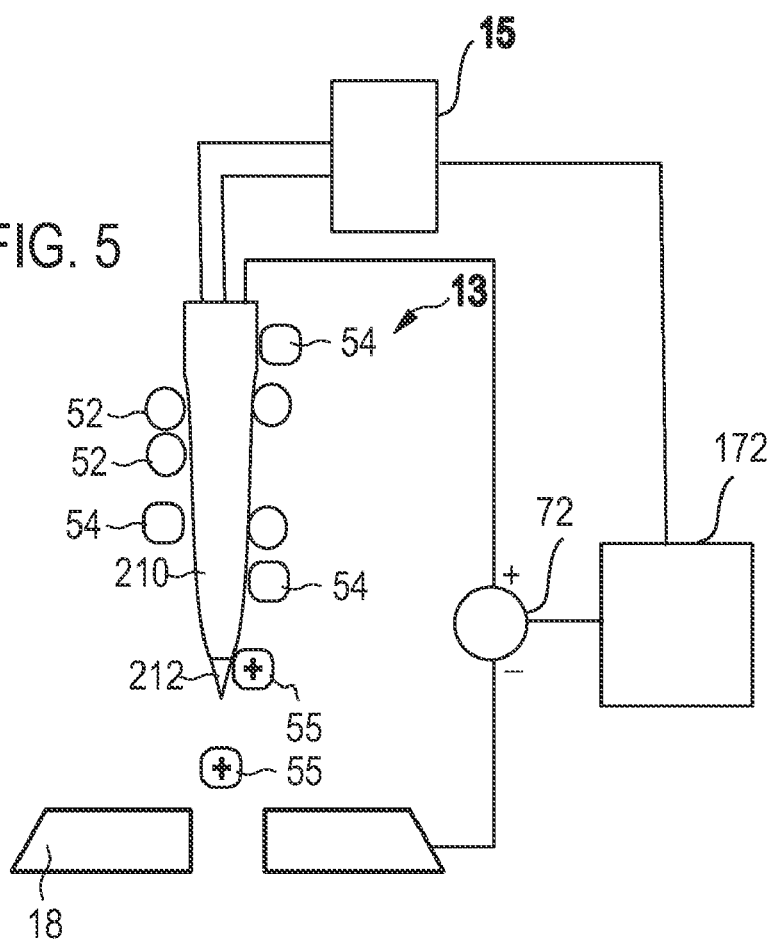
FIG. 5 shows a schematic view of an emitter tip in a gas field ion source and the principle of operation of the emitter tip in a second mode of operation according to embodiments described herein.

The dual or multiple modes of operation, which are provided according to embodiments described herein, can be better understood with respect to FIGS. 4 and 5. As an example, reference is made to helium as a light (first) gas and argon as a second (heavy) gas. It is to be understood that according to other embodiments any combination of gases described herein can be used.

As mentioned above, according to some examples of embodiments, the selection of different ion species can be conducted based on different ionization energies. Hence, one possibility to switch between gases is to switch the extraction voltage of the emitter tip 13.

Within FIG. 4, a voltage is provided by the voltage source 72 between the emitter 13 and the extraction electrode 18. The voltage source can be controlled by controller 172. According to some embodiments, the controller 172 can be in communication with controller 130 (not shown in FIG. 4) for the supply of the first and the second gas inlet. The emitter includes a shank 210 and a tip 212. For the example illustrated in FIG. 4, a mixture of helium atoms 52 and argon atoms 54, which are indicated by different shapes, is provided to be able to condensate or be deposited at the shank 210 of the emitter tip 13. Typically, helium requires an electrical field of approximately 44 V/nm for ionization, while argon requires an electrical field of approximately 22 V/nm for ionization. If, for example, a helium ion beam of helium ions 53 is to be formed, the voltage supply 72 is adjusted such that an extraction voltage, which provides at at least a part of the tip surface an electrical field of approximately 44 V/nm or slightly higher, is applied at the position of the tip 212. As shown in FIG. 4, helium atoms 52 condensate or are deposited at the shank 210 and move by diffusion or drift towards the tip 212 where the helium atoms are ionized. For the voltage provided between the emitter tip and the extractor electrode as indicated in FIG. 4 the helium atoms 52 are ionized at the vicinity of the tip in light of the higher electric field due to the small radius of the tip. Since the ionization energy of argon is significantly lower as compared to the ionization energy of helium, the argon atoms 54 are ionized to argon ions 55 before they reach the tip 212. Accordingly, argon ions are generated at the shank 210 and do not reach the emitter tip because they are ionized earlier while they diffuse along the emitter shank. In light of the positive potential of the shank 210 the argon ions are repelled by the shank and do not form a collimated beam at the tip. Since the argon ions are emitted from a much larger region as compared to the helium ions, argon does not form a collimated beam under the voltage supply conditions indicated in FIG. 4.

According to some embodiments, which can be combined with other embodiments described herein, it would be possible to provide a mass separator 742 (see, e.g., FIGS. 1A and 1B) such as a magnetic deflector, a Wien-filter or the like in the event a significant number of argon ions would travel along the optical access and would reach the sample.

For a second mode of operation, which is illustrated in FIG. 5 the voltage supply 72 is adjusted to apply a voltage such that the extraction voltage provides at at least a part of the tip surface an electrical field of approximately 22 V/nm or slightly above this value. Thereby, the maximum electric field is significantly below the value required for ionization of helium. Accordingly, only argon is ionized, and argon ions 55 are generated in the vicinity of the tip 212. As described above, the argon atoms condense at the shank 210 of the emitter 13 and diffuse and/or drift towards the tip by a concentration gradient and/or an electric field along the shank 210. Since the field strengths illustrated in FIG. 5 are too low for helium ionization, an argon beam is formed and guided through extraction electrode 18 along the optical access towards the specimen.

As shown in FIG. 5, helium atoms 52 condensate, or are deposited at the shank 210 of the emitter 13. Since helium is not emitted from the emitter tip, it might accumulate on the tip. Depending on the operation conditions, the accumulated helium may reduce the argon supply along the shank 210. If the argon supply along the shank towards the tip 212 is reduced to an unacceptable amount, a short pulse with a high field strength can be applied to emit the helium atoms and reduce the amount of helium atoms that are condensed on the emitter tip 13. According to additional or alternative embodiments, the emitter tip can be heated by, for example, a short current pulse through the supporting wire to evaporate the absorbed gases. Thereby a similar or additional effect can be generated.

According to some embodiments, which can yield by a combination with other embodiments described herein, the ratio between the "light" gas and the heavy gas can be adjusted according to requirements. Since heavy species are used for etching etc., which should be done fast, concentration of heavy species can be larger than concentration of He.

By switching the potential difference between the emitter tip 13 and the extraction electrode 18, or by other adjustments to change the electrical field at the tip 212, different modes of operation for emitting different ion beams can be generated.

According to embodiments described herein, a gas mixture can be provided in a range of $10^{-4}$ mbar to $10^{-2}$ mbar.

According to embodiments described herein, which can be combined with other embodiments described herein, at least two different voltages are provided by the power supply 72. According to a first operational mode a voltage is provided that corresponds to a high electric field at the position of the tip of the emitter tip 13 where the highest electric field is provided. Thereby the emitter tip provides three different regions with respect to a first, lower electric field and a second, higher electric field. At the very top of the shank 210, the electric field is below the first and the second electric field. At an intermediate portion of the shank 210, an electric field is equal to the first, lower electric field such, that the first species can be ionized. Further, in the vicinity of the tip with the smallest curvature an electric field equal to or at least having the second, higher electric field is provided. Thereby according to this mode of operation, two species get ionized. However, only one of them forms an accumulated beam at the tip of the emitter tip 13.

For the second mode of operation, the electric field is below the first, lower electric field along the majority of the emitter tip 13. The first, lower electric field is reached only at the portion of the emitter tip with the smallest curvature or in the vicinity of this position. Accordingly, only one species is ionized.

As mentioned above, the selection of different ion species can be conducted by the selection of the emitter tip temperature. Hence, another possibility to switch between gases is to switch the temperature of the emitter tip 13.

According to one example of embodiments, while providing a constant electric field by establishing a constant extraction voltage, the ion current of a first gas may be at maximum at a first tip temperature, while the ion current of a second gas may be at maximum at a second tip temperature. The constant extraction voltage may for instance be an extraction voltage chosen from a range between an extraction voltage, at which one of the gases has a sufficient emission current at commonly used cooling temperatures, and an extraction voltage, at which another one of the gases has a sufficient emission current at commonly used cooling temperatures. For instance, when applying an extraction voltage providing at at least a part of the tip surface an electrical field in the range of about 20 V/nm to about 50 V/nm at the emitter tip 13, an argon ion current may be at a maximum at tip temperatures of about 80 K, while He has an emission maximum at about 20 K. The gas to be emitted preferentially is thus chosen by switching the temperature of the tip.

If, for instance, a closed cycle He cryocooler is used for cooling the emitter tip, e.g., a pulse tube cooler, a Gifford-Mc-Mahon cooler, a Stirling cooler, a fast switching between temperatures can be attained by having the cooler constantly operating at the lower temperature required for helium. If the higher temperature for e.g., argon emission is needed, the heater 15, e.g., a resistive heater, located close to the emitter tip is switched on, so that the temperature rises. In this way, fast switching of temperatures is achieved, because the temperature of the tip changes, while the cooler itself with its high heat capacitance stays at the same temperature.

Within an example illustrated referring to FIG. 4, a constant voltage may be provided by the voltage source 72 between the emitter 13 and the extraction electrode 18. The heater 15 connected to the emitter tip 212 is controlled by controller 172, which may also control the voltage source 72. For controlling the tip temperature, a temperature sensor (not shown) connected to the controller 172 may be provided e.g., at the emitter tip support. As a cooling unit, e.g., a closed cycle He cryocooler (not shown) is connected to the emitter tip support and used for cooling the emitter tip 13. According to some embodiments, the controller 172 can be in communication with controller 130 for the supply of the first and the second gas inlet. The emitter includes a shank 210 and a tip 212, for instance an ultra sharp tip or a tip including a supertip. For the example illustrated in FIG. 4, a mixture of helium atoms 52 and argon atoms 54, which are indicated by different shapes, is provided to be able to condensate or be deposited at the shank 210 of the emitter tip 13. Helium requires an electrical field of approximately 44 V/nm for ionization, while argon requires an electrical field of approximately 22 V/nm for ionization. For example, the voltage supply 72 is adjusted such that an extraction voltage, which provides at at least a part of the tip surface an electrical field of e.g., approximately 44 V/nm or slightly higher, is applied at the position of the tip 212. Moreover, the heater 15 is not operated, such that at the emitter tip 13 a temperature of e.g., about 20 K is provided. As shown in FIG. 4, helium atoms 52 and argon atoms 54 condensate, or are deposited, at the shank 210, and move by diffusion or drift towards the tip 212. Since the tip temperature corresponds to the temperature at which helium has its emission maximum, also referred to herein as emission maximum temperature, the helium atoms are ionized. For the voltage provided between the emitter tip and the extractor electrode as indicated in FIG. 4, the helium atoms 52 are ionized at the vicinity of the tip. Since the emission, maximum temperature of argon is significantly higher (80 K) as compared to the emission maximum temperature of helium (20 K), a substantial amount of the helium atoms 52 are ionized, while the argon atoms 54 predominantly are not ionized. Hence, a collimated beam of helium ions 53 is generated under the voltage and temperature conditions described with respect to FIG. 4. Accordingly, for ionizing a substantial amount of the argon atoms 54, the heater 15 is switched on. This situation is illustrated in FIG. 5. Thereby, the ionization efficiency for the argon atoms 54 is maximized while the helium atoms 52 predominantly are not ionized.

Hence, a collimated beam of argon ions 55 is generated at the tip 212 under the temperature and voltage supply conditions provided in the situation illustrated in FIG. 5.

Of course, this principle can be applied for other combinations of a plurality of gases with different optimum emission temperatures.

Moreover, for providing a constant electric field in the present example of embodiments, other suitable extraction voltages may be applied. For instance, an extraction voltage may be chosen at or in the vicinity of an extraction voltage providing an electric field at which one of the gases has a maximum emission current at commonly used cooling temperatures. In another example, an extraction voltage may be chosen from a range between an extraction voltage, at which one of the gases has a sufficient emission current at commonly used cooling temperatures, and an extraction voltage, at which another one of the gases has a sufficient emission current at commonly used cooling temperatures. Typically, an extraction voltage may be chosen, which provides the electric field for ionizing the one of e.g., two gases, which has the higher ionization energy, while cooling at commonly used cooling temperatures. In another typical example, an extraction voltage may be chosen, which provides the electric field for ionizing the one of e.g., two gases, which has the smaller ionization energy, while cooling at commonly used cooling temperatures. In any case, ionization of the other of the e.g., two gases may then be initiated by heating the emitter tip.

In further embodiments, the principle of switching the tip temperature and of switching the extraction voltage can be combined to attain maximum efficiency. In some embodiments, more than two gases may be provided, and the gas to be emitted preferentially is chosen by providing more than two temperatures of the tip, and optionally more than two extraction voltages and/or optionally adapting the partial pressure of the gas. Correspondingly, in some embodiments, more than two different ion beams may be generated by switching between more than two different emitter tip temperatures, and optionally switching between more than two different extraction voltages and/or optionally switching between more than two different gases.

Hence, in one embodiment, a method of operating a focused ion beam device is provided, wherein at least two different ion beams of a first gas and at least one second gas are consecutively generated by switching between at least two different emitter tip temperatures, and optionally by switching between at least two different extraction voltages and/or between at least two of the first gas and the at least second gas, the emitter tip temperatures and the extraction voltages each providing ionization of at least one of the gases. In some embodiments, the emitter tip temperatures and/or the extraction voltages each provide an optimum, e.g., maximum, ionization efficiency of at least one of the gases.

For instance, according to one example of embodiments, referring to FIG. 4, a voltage may be provided by the voltage source 72 between the emitter 13 and the extraction electrode 18. The heater 15 adjacent to the emitter tip 212 is controlled by controller 172, which may also control the voltage source 72. For controlling the tip temperature, a temperature sensor (not shown) connected to the controller 172 may be provided e.g., at the emitter tip support. As a cooling unit, e.g., a closed cycle He cryocooler (not shown) is connected to the emitter tip support and used for cooling the emitter tip 13. According to some embodiments, the controller 172 can be in communication with controller 130 for the supply of the first and the second gas inlet. The emitter includes the shank 210 and the tip 212. For the example illustrated in FIG. 4, a mixture of helium atoms 52 and argon atoms 54, which are indicated by different shapes, is provided and may adsorb or be deposited at the shank 210 of the emitter tip 13. As mentioned above, typically, helium requires an electrical field of approximately 44 V/nm for ionization, while argon requires an electrical field of approximately 22 V/nm for ionization. If, for example, a helium ion beam of helium ions 53 is to be formed, the voltage supply 72 is adjusted such that e.g., an extraction voltage, which provides at at least a part of the tip surface an electrical field of e.g., approximately 44 V/nm or slightly higher, is applied at the position of the tip 212. Moreover, the heater 15 is not operated, such that at the emitter tip 13, a temperature of e.g., about 20 K is provided. As shown in FIG. 4, helium atoms 52 and argon atoms 54 condensate, or are deposited at the shank 210, and move by diffusion or drift towards the tip 212. Since the tip temperature corresponds to the temperature and the electric field at the emitter tip 13 corresponds to the electric field, at which helium has its emission maximum, the helium atoms are ionized, while the argon atoms 54 predominantly are not ionized. Hence, a collimated beam of helium ions 53 is generated under the voltage and temperature conditions described with respect to FIG. 4. If a substantial amount of the argon atoms 54 is to be ionized, the heater 15 is switched on, in order to heat the emitter tip to e.g., about 80 K. Further, the voltage supply 72 is adjusted such that an extraction voltage, which provides at at least a part of the tip surface an electrical field of e.g., approximately 22 V/nm or slightly higher is applied at the position of the tip 212. The switching of the emitter tip temperature and the extraction voltage at the emitter tip can be performed substantially simultaneously. In the present example, when both the emitter tip temperature and the extraction voltage at the emitter tip have been switched, the ionization efficiency for the argon atoms 54 is maximized while the helium atoms 52 predominantly are not ionized. This situation is depicted in FIG. 5. Hence, a collimated beam of argon ions 55 is generated at the tip 212 under the temperature and voltage supply conditions provided in the situation described referring to FIG. 5.

FIG. 6 illustrates embodiments of further focused ion beam devices 600, which may be combined with any other embodiment disclosed herein. The charged particle beam device includes an emitter 12 having an emitter area, optionally an enclosure/gun chamber 14, and an ion beam column 16. An electric field is provided between the emitter tip of the emitter 12 and the extraction electrode 18. Ions of gases, which are present in the enclosure 14, are generated by the high electric field in the vicinity of the small curvature of the tip portion of the emitter tip, e.g., a tip being an ultra sharp tip or having a supertip.

According to one embodiment, a first gas inlet 110, a second gas inlet 112 and a third gas inlet 613 are provided. Thereby, three different gases and/or a mixture thereof can be provided in the enclosure. For example, a light gas like hydrogen or helium may be introduced through the first gas inlet 110 for observation of a specimen without damaging the specimen. For a different mode of operation, a second gas like argon, neon, xenon or krypton may be introduced through the second gas inlet 112 for sputtering of a specimen. For an even further mode of operation, a third gas having different properties with respect to sputtering or sample modification can be used.

According to further embodiments, hydrogen may be used with regard to the even further mode of operation in the event materials like a photo resist are etched. The reducing property of hydrogen may be used for an etching of oxygen-containing materials. Nevertheless, hydrogen may be used in an imaging mode for a plurality of materials, like silicon, metals, and the like.

According to an even further embodiment, a fourth gas inlet could be provided. Thereby, a fourth mode of operation can be conducted by introducing a conditioning gas (e.g., oxygen) in the enclosure around the emitter tip. According to this embodiment, oxygen can be used for conditioning the tip. This further conditioning mode of operation, wherein the tip of the emitter is shaped or re-shaped, may be supported by the introduction of oxygen. According to yet further embodiments, a fourth or fifth gas may also be used for imaging and/or sample modification modes of operation.

Generally, within the embodiments described herein, at least two different gases for generating an ion beam or ion beams, the gases also referred to herein as ion beam generating gases, can be introduced in the enclosure. According to embodiments described herein, the at least two different ion beam generating gases are introduced as a gas mixture in the enclosure, and the ion beam, which is generated to be guided through the column of the focused ion beam device, can be selected by changing the emitter tip temperature and optionally the voltage between the emitter tip 13 and an extraction electrode or another electrode provided to adjust the electric field at the tip portion of the emitter tip.

As explained above, a light gas and a heavy gas can be used as ion generating gases. According to further embodiments, at least one further ion generating gas can be introduced in the enclosure. Thereby, an ion generation gas for etching or an ion generation gas for a second sputtering option (e.g., first sputtering option with argon and second sputtering option with neon or xenon) can be introduced. According to some embodiments, at least a third gas inlet or a mixture of three gases is provided. In the event more than one ion beam generating gas for sputtering or more than one ion beam generating gas for etching is used, also a fourth, fifth, etc. gas inlet or a mixture of four, five etc. gases can be provided.

Yet according to further embodiments, processing gases in the form of the above-mentioned emitter tip conditioning gas (oxygen), carrier gases, purge gases, or the like may be introduced. Processing gases are to be understood as gases, which are not used for ion beam generating, but for process support instead.

According to another embodiment, which is described with respect to FIG. 6 and may be combined with any other embodiment disclosed herein, additionally a gas outlet 620 can be provided. The gas outlet 620 may be connected to a vacuum system including a vacuum pump and/or a vacuum recipient. An evacuation of the enclosure 14 can be used to control the pressure in the enclosure and, thereby, control a process parameter for the ion generation. Typically, a partial pressure of the gas to be ionized is controlled to be in the range of $10^{-6}$ to $10^{-2}$ mbar in the area of the emitter. According to another embodiment, the evacuation of the enclosure 14 can be used during a switching between a first operational mode and a further (second or third) operational mode. Thus, a gas used for the first operational mode can be removed faster from the area of ion generation. As a consequence, a switching between one mode of operation and another mode of operation can be conducted faster, for example, in 5 s or less.

For some embodiments, which can be combined with other implementations, a gas pressure gradient in the gun chamber can be provided. Thereby, the gas pressure is higher in the vicinity of the emitter and the emitter tip and is reduced towards an extraction electrode. Thereby, a sufficient amount of gas can be provided to the emitter tip, and the amount of gas that may disturb the ion emission is reduced. According to different examples, which can be combined with any of the embodiments described herein, the gas pressure gradient may reach from $10^{-5}$ mbar to $10^{-3}$ mbar, typically from $10^{-4}$ mbar to $5\times10^{-3}$ mbar.

Within FIG. 7A, a charged particle beam device 700 is shown. The charged particle beam device includes an emitter 12, an enclosure/gun chamber 14, and an ion beam column 16. Ions of gases, which are present in the enclosure 14, are generated by the high electric field of the biased emitter 12.

According to one embodiment, a first gas inlet 110 and a second gas inlet 112 are provided. Additionally, valve 718 is provided within the first gas inlet 110. Further, valve 719 is provided within the second gas inlet 112. The valves are controlled by a controller adapted for switching between introducing the first gas in the enclosure 14 and introducing the second gas in the enclosure.

According to one embodiment, valves 718 and 719 are positioned close to the outlet opening of the gas inlets. Thereby, the amount of gas remaining from a previous operational mode, which has to be removed for a second or third operational mode, is reduced. When one of the valves is closed, the volume, in which the gas of the previous operational mode is still present, is minimized if the valve is positioned close to the outlet opening of the gas inlet. The dead volume of the gas inlet may for example be in the range of 1 $cm^3$ or less. Typically, micro-valves may be used to realize a small dead volume. Herein, a dead volume may be defined as a part of a passage, where a portion could retain materials or gases to contaminate subsequent flow media. During switching, the previous gas may contaminate the subsequent gas.

According to other embodiments referred to with respect to FIG. 7A, a gas outlet 620 can also be provided. The gas outlet 620 may be connected to a vacuum system including a vacuum pump or a vacuum recipient. As described above, an evacuation of the enclosure 14 can be used to control the pressure in the enclosure. The evacuation of the enclosure 14 can also be used to evacuate the enclosure during a switching between a first operational mode and a further (second or third) operational mode. Thus, a gas used for the first operational mode can be removed faster from the area of ion generation.

Within FIG. 7B, the charged particle beam device includes an emitter 12, an enclosure/gun chamber 14, and an ion beam column 16. Ions of gases, which are present in the enclosure 14, are generated by the high electric field of the biased emitter 12. The gases can be introduced in the enclosure according to any of the embodiments described herein.

According to another embodiment, as, for example, described with respect to FIG. 7B, a valve 728 is provided within the gas outlet 620. The valve 428 within the gas outlet may be closed in order to provide a low pressure on the side of the valve opposing the enclosure 14. Thereby, it is possible during a switching between the first operational mode and a further operational mode to open the valve and use the low-pressure on the opposing side for a faster removal of the gas in the enclosure, which has to be removed for switching between the operational modes.

Figure 8:
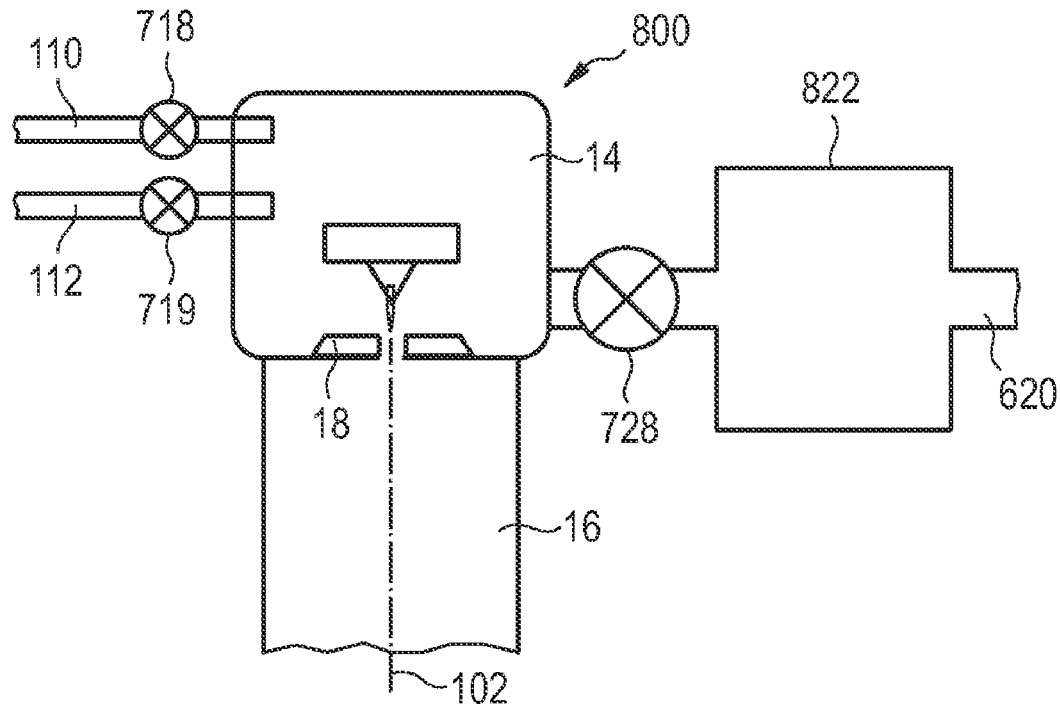
FIG. 8 shows a schematic view of parts of a charged particle beam device in the form of a focused ion beam device with gas inlets, valves and a vacuum recipient according to embodiments described herein.

This aspect may, according to an even further embodiment, be combined with a vacuum recipient 822 as shown in the focused ion beam device 800 of FIG. 8. Within FIG. 8, a charged particle beam device 800 is shown. The charged particle beam device includes an emitter 12, an enclosure/gun chamber 14, and an ion beam column 16. Ions of gases, which are present in the enclosure 14, are generated by the high electric field of the biased emitter 12. Additionally, valve 718 is provided within the first gas inlet 110. Further, valve 719 is provided within the second gas inlet 112. The valves are controlled by a controller adapted for switching between introducing the first gas in the enclosure 14 and the second gas in the enclosure. When one of the valves is closed, the volume-in which the gas of the previous operational mode is still present and which needs to be removed for switching to another operational mode-is minimized if the valve is positioned close to the outlet opening of the gas inlet.

Within FIG. 8, the conduit of the gas outlet 620 is connected to a vacuum pump. The vacuum pump evacuates the vacuum recipient 822. Thus, an enlarged volume with low pressure is provided. During opening of valve 728, the volume of the enclosure 14 can be evacuated faster as a consequence of the additional volume of recipient 822. The shorter time for evacuation of the enclosure allows for a faster switching between the two operational modes.

Figure 9:
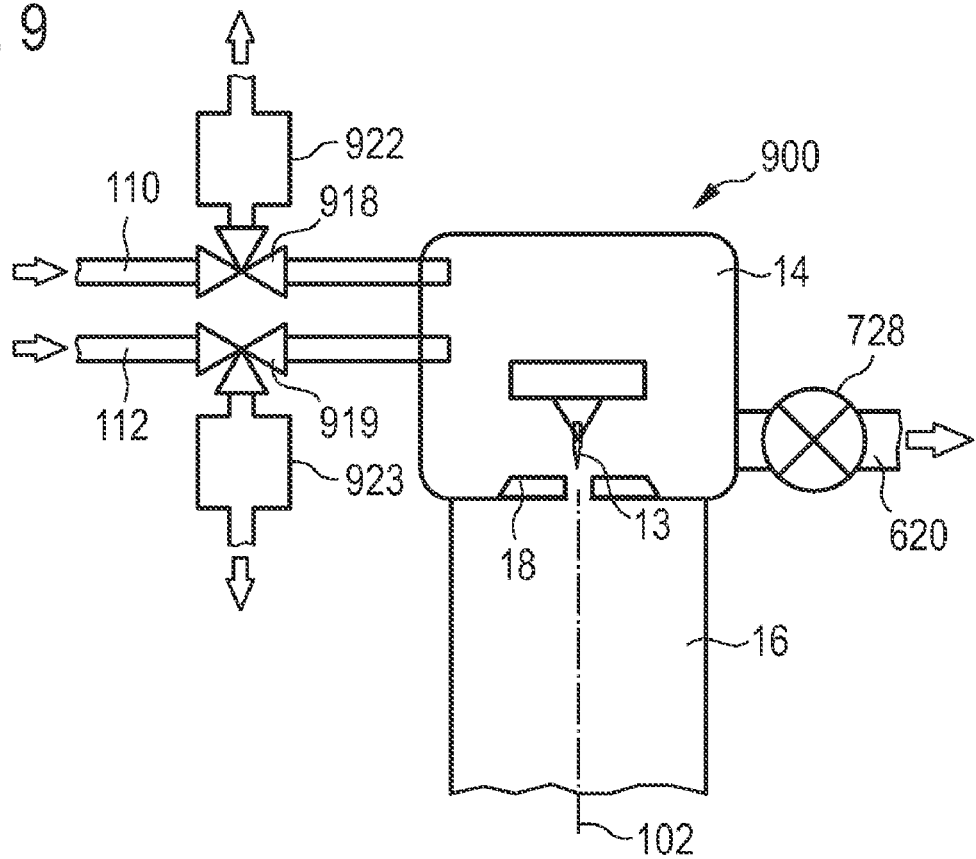
FIG. 9 shows a schematic view of parts of a charged particle beam device in the form of a focused ion beam device with gas inlets, valves and vacuum recipients according to embodiments described herein.

FIG. 9 shows the focused ion beam device 900. The charged particle beam device 900 includes an emitter 12, an enclosure/gun chamber 14, and an ion beam column 16. Ions of gases, which are present in the enclosure 14, are generated by the high electric field of the biased emitter 12.

According to one embodiment, a first gas inlet 110 with a conduit and a second gas inlet 112 with a conduit are provided. Additionally, valve 818 is provided within the first gas inlet 110. Further, valve 819 is provided within the second gas inlet 112. The valves are controlled by a controller adapted for switching between introducing the first gas in the enclosure 14 and the second gas in the enclosure. According to one embodiment, valves 818 and 819 are positioned close to the outlet opening of the gas inlets. Thereby, the amount of gas remaining from a previous operational mode, which has to be removed for a second or third operational mode, is reduced.

Within FIG. 9, valves 818 and 819 are 2-way valves. The further connections of the valves are connected to vacuum recipients 822 and 823, respectively. The vacuum recipients 822 and 823 are evacuated by a vacuum pump or the like. Thereby, an improved switching behavior between a first mode of operation and a further mode of operation may be provided. When for example valve 818 is closed, on the one hand, the supply of the first gas, which has been introduced by the first gas inlet 110, is stopped. On the other hand, the vacuum recipient 822 is connected to the outlet opening portion of the gas inlet. Thereby, the gas remaining in the outlet opening portion of the gas inlet is removed therefrom, and the enclosure 14 is evacuated. Currently or thereafter, the valve 819 within the second gas inlet 112 is opened, such that the gas introduced through the second gas inlet can be supplied in the enclosure 14.

According to another embodiment, valves 818 and 819 may be connected with respective conduits to a common vacuum recipient.

According to one embodiment, as shown in FIG. 9, a further gas outlet 620 including valve 728 is provided. The valve 728 within the gas outlet may be closed in order to provide a low pressure on the side of the valve opposing the enclosure 14. Thereby, it is possible during a switching between the first operational mode and a further operational mode to open the valve and use the low-pressure for a faster removing of the gas in the enclosure, which has to be removed for switching between the operational modes.

According to another embodiment, the gas outlet 620 may be omitted. The enclosure 14 may then be evacuated through one of the valves 818 and 819, respectively. Thereby, when one of the valves is in a position to introduce a gas in the area of the emitter 12, the other valve is in a position to evacuate the enclosure 14 via the vacuum recipient connected to the corresponding valve. Generally, by using a 2-way valve, in order to shut off the gas flow, the connection between the gas and the emitter chamber, that is the enclosure, is closed, and the connection between the emitter chamber and the vacuum recipient or vacuum pump is opened. This results in an immediate drop of the gas pressure in the emitter.

In addition to the modes of operation, which have been described above, the heavy gas ion beam can be used for material analysis. Thereby, a detector suitable for secondary ion mass spectrometry SIMS 722 (see, e.g., FIGS. 1A and 1B) is provided. The detector detects and analyzes the ions of a specimen, which are created by sputtering. On sputtering, the specimen emits particles, some of which are themselves ions. These secondary ions are measured with a mass spectrometer to determine the quantitative elemental or isotopic composition of the surface.

According to one embodiment, the sputtering is realized by the ion beam emitted by emitter 12 as shown in the previous figures. According to another embodiment, an additional flood electron source 732 (see, e.g., FIGS. 1A and 1B) may be provided. Thereby the number of ionized secondary particles, which are released from the specimen on impingement of the ion beam from emitter 12, can be increased. The increased amount of ionized secondary particles improves the detection sensitivity of the detector.

As described above, a single column charged particle beam device in the form of a focused ion beam device can be provided which allows for a high-resolution imaging and sample modification. Thereby, in light of the fact that only one column is used, a reduction of costs can be achieved.

According to one embodiment, which may be combined with any other embodiment disclosed herein, a focused ion beam device is provided, including: an ion beam column adapted to house a gas field ion source emitter with an emitter tip and an emitter area for generating ions; a heating means adapted to heat the emitter tip; one or more gas inlets adapted to introduce a first gas and at least a second gas to the emitter area; and a controller adapted to switch between a first emitter tip temperature and at least a second emitter tip temperature for generating an ion beam of ions of the first gas or an ion beam of ions of the at least second gas.

According to one embodiment which may be combined with any other embodiment disclosed herein, the heating means is at least one element selected from the group consisting of a resistance heater, an electromagnetic heater, an induction heater, a radiant heater, an IR heater, a particle source and a laser.

According to one embodiment which may be combined with any other embodiment disclosed herein, the heating means is positioned adjacent to the emitter tip.

According to one embodiment which may be combined with any other embodiment disclosed herein, the emitter tip is provided at a support including filaments and a filament base, wherein the heating means is adapted to heat at least one element selected from the group consisting of the emitter tip, the filaments and the filament base.

One embodiment, which may be combined with any other embodiment disclosed herein, includes an electrode adapted to extract ions from the gas field ion source emitter and a voltage supply adapted to provide a voltage between the electrode and the gas field ion source emitter.

According to one embodiment which may be combined with any other embodiment disclosed herein, the controller is further adapted to switch between a first voltage and at least one second voltage of the voltage supply for generating an ion beam of ions of the first gas or an ion beam of ions of the at least one second gas.

According to one embodiment which may be combined with any other embodiment disclosed herein, the first gas is a light gas which is at least one gas selected from the group consisting of a gas having an atomic mass of less than 10 g/mol, hydrogen and helium, and the at least one second gas is at least one gas selected from the group consisting a heavy gas which has an atomic mass of 10 g/mol or higher, and a reactive gas.

According to one embodiment which may be combined with any other embodiment disclosed herein, the heavy gas is at least one gas selected from the group consisting of a physical sputtering gas, argon, neon, and krypton, and the reactive gas is at least one gas selected from the group consisting of oxygen, hydrogen and $CO_2$.

One embodiment, which may be combined with any other embodiment disclosed herein, further includes a gas outlet connected to a vacuum system adapted to evacuate at least the emitter area.

One embodiment, which may be combined with any other embodiment disclosed herein, further includes: a first valve provided within a first gas inlet of the gas inlets and at least one second valve provided within at least one second gas inlet of the gas inlets, wherein the first valve and the at least one second valve are controlled for adapting the partial pressures of the first gas and the at least one second gas.

In one embodiment, which may be combined with any other embodiment disclosed herein, a method of operating a focused ion beam device is provided, including biasing an emitter with an emitter tip within an emitter area wherein ions are generated to a potential for providing an extraction voltage for emitting an ion beam of at least one gas of a first gas and at least one second gas; heating to a first emitter tip temperature to emit an ion beam of the first gas, and heating to at least one second emitter tip temperature to emit at least one ion beam of the at least one second gas.

According to one embodiment, which may be combined with any other embodiment disclosed herein, the emitter is biased to a potential for providing an extraction voltage for emitting an ion beam of the first gas.

One embodiment, which may be combined with any other embodiment disclosed herein, includes, in the step of heating to a first emitter tip temperature, biasing to a first potential providing an extraction voltage of the first gas.

One embodiment, which may be combined with any other embodiment disclosed herein, includes, in the step of heating to a first emitter tip temperature, biasing to a first potential providing an extraction voltage of the first gas and, in the step of heating to at least one second emitter tip temperature, biasing to at least one second potential providing an extraction voltage of the at least one second gas.

One embodiment, which may be combined with any other embodiment disclosed herein, includes, in the step of heating to at least one second emitter tip temperature, biasing to at least one second potential providing an extraction voltage of the at least one second gas.

In one embodiment, which may be combined with any other embodiment disclosed herein, the first gas is a light gas, and the at least one second gas is at least one gas selected from the group consisting of a heavy inert gas and a reactive gas, wherein the ion beam of the first gas is generated for an observation mode, an ion beam of the heavy inert gas is generated for a sputtering mode, and an ion beam of the reactive gas is generated for a reaction mode.

One embodiment which may be combined with any other embodiment disclosed herein includes scanning the ion beam generated from the first gas over a specimen for an observation mode and detecting corpuscles released from the specimen on impingement of the ion beam generated from the first gas for observation of the specimen.

One embodiment which may be combined with any other embodiment disclosed herein includes modifying the specimen during a modification mode, during a time when the at least one second gas is introduced in the emitter area.

According to one embodiment which may be combined with any other embodiment disclosed herein, the modifying includes at least a step selected from the group consisting of sputtering and etching.

According to one embodiment which may be combined with any other embodiment disclosed herein, the first gas is at least one gas selected from the group consisting of a light gas, a gas having an atomic mass of less than 10 g/mol, hydrogen and helium.

According to one embodiment which may be combined with any other embodiment disclosed herein, the at least one second gas is at least one gas selected from the group consisting of a heavy gas, a physical sputtering gas, a gas having an atomic mass of 10 g/mol or higher, argon, neon, krypton, a reactive gas, a processing gas, oxygen, hydrogen and $CO_2$.

One embodiment, which may be combined with any other embodiment disclosed herein, further includes at least one step selected from the group consisting of introducing a processing gas in the emitter area and optionally heating to a further tip temperature, wherein the processing gas optionally is oxygen; introducing a further heavy gas into the emitter area, wherein the further heavy gas has an atomic mass of 10 g/mol or higher, and optionally heating to a further tip temperature; and introducing hydrogen into the emitter area for an etching operation mode and optionally heating to a further tip temperature, and separating ions of the first gas from ions of the at least one second gas.

According to a further embodiment, which may be combined with any other embodiment disclosed herein, the processing gas is oxygen.

According to a further embodiment, which may be combined with any other embodiment disclosed herein, a focused ion beam device is provided, including an ion beam column including an enclosure for housing an emitter with an emitter tip and an emitter area for generating ions of a first gas and at least one second gas and means for switching between a first emitter tip temperature and at least one second emitter tip temperature, wherein the first gas is selected from the group consisting of hydrogen and helium and the at least one second gas has an atomic mass of 10 g/mol or higher.

According to one embodiment which may be combined with any other embodiment disclosed herein, the first valve has a first gas supply conduit to a gas supply for the first gas, a first gas inlet conduit for introducing the first gas in the chamber and a first evacuation conduit for connection to at least one vacuum recipient, and wherein the second valve has a second gas supply conduit to a gas supply for the second gas, a second gas inlet conduit for introducing the second gas in the chamber and a second evacuation conduit for connection to the at least one vacuum recipient.

According to one embodiment which may be combined with any other embodiment disclosed herein, the first gas inlet and the second gas inlet provide the gas into a common gas inlet for supply in the enclosure.

According to one embodiment which may be combined with any other embodiment disclosed herein, the vacuum system includes a vacuum recipient.

One embodiment, which may be combined with any other embodiment disclosed herein, further includes a scan deflector provided in the ion beam column and adapted for scanning an ion beam over a specimen, a detector provided in the ion beam column and adapted for time resolved detection of corpuscles released from the specimen on impingement of the ion beam, and a controller connected to the scan deflector and the detector.

According to one embodiment which may be combined with any other embodiment disclosed herein, the time resolved measurement is adapted for a time resolution of 2 μs or below 2 μs.

According to one embodiment, which may be combined with any other embodiment disclosed herein, the enclosure is provided in a gun chamber of the ion beam column.

According to one embodiment, which may be combined with any other embodiment disclosed herein, the enclosure has a volume of 5 $cm^3$ or less.

One embodiment, which may be combined with any other embodiment disclosed herein, further includes a mass spectrometer for identification of ions or ionized particles released from the specimen.

One embodiment, which may be combined with any other embodiment disclosed herein, further includes a flood electron gun provided in an area adjacent to a specimen area.

One embodiment, which may be combined with any other embodiment disclosed herein, further includes at least a third gas inlet for introducing at least a third gas into the enclosure.

One embodiment, which may be combined with any other embodiment disclosed herein, further includes at least a third valve provided within the at least third gas inlet being controlled by the controller.

According to one embodiment, which may be combined with any other embodiment disclosed herein, the first gas is a light gas selected from the group consisting of hydrogen and helium, wherein the second gas is a heavy gas selected from the group consisting of argon, neon, krypton, and combinations thereof.

One embodiment, which may be combined with any other embodiment disclosed herein, further includes a mass separator for separating ions from the first gas from ions from the second gas.

One embodiment, which may be combined with any other embodiment disclosed herein, further includes biasing the emitter within the emitter area wherein ions are generated to a first potential for providing a first extraction voltage for emitting an ion beam of a light gas and biasing the emitter within the emitter area wherein ions are generated to a second potential for providing a second extraction voltage for emitting an ion beam of a heavy gas, wherein the light gas is selected from the group consisting of hydrogen and helium and the heavy gas has an atomic mass of 10 g/mol or higher.

One embodiment, which may be combined with any other embodiment disclosed herein, further includes evacuating an enclosure surrounding the emitter area.

According to one embodiment, which may be combined with any other embodiment disclosed herein, the switching includes controlling a power supply for an extraction voltage.

One embodiment, which may be combined with any other embodiment disclosed herein, further includes scanning the ion beam generated from the light ion beam generating gas over a specimen for an observation mode, detecting corpuscles released from the specimen on impingement of the ion beam from the light ion beam generating gas for observation of the specimen, and modifying the specimen during a modification mode, during a time when the heavy ion beam generating gas is introduced in the emitter area.

One embodiment, which may be combined with any other embodiment disclosed herein, further includes mass detecting of ionized particles released from the specimen during a time when the heavy ion beam generating gas is introduced in the emitter area.

One embodiment, which may be combined with any other embodiment disclosed herein, further includes ionizing particles released from the specimen during a time when the heavy ion beam generating gas is introduced in the emitter area.

In one embodiment, which may be combined with any other embodiment disclosed herein, a method of operating a focused ion beam device is provided, wherein at least two different ion beams of a first gas and at least one second gas are consecutively generated by switching between at least two different emitter tip temperatures, and optionally by switching between at least two different extraction voltages and/or between at least two of the first gas and the at least second gas, the emitter tip temperatures and the extraction voltages each providing ionization of at least one of the gases.

In a further embodiment, which may be combined with any other embodiment disclosed herein, a method of operating a focused ion beam device is provided, wherein at least two different ion beams of a first gas and at least one second gas are consecutively generated by switching between at least two different emitter tip temperatures, the emitter tip temperatures each providing ionization of at least one of the gases.

In one embodiment, which may be combined with any other embodiment disclosed herein, the at least two different ion beams of the first gas and the at least one second gas are consecutively generated by additionally switching between at least two different extraction voltages and/or between at least two of the first gas and the at least second gas, the emitter tip temperatures and the extraction voltages each providing ionization of at least one of the gases.

The written description uses examples to disclose the invention, including the best mode, and also to enable any person skilled in the art to make and use the invention. While the invention has been described in terms of various specific embodiments, those skilled in the art will recognize that the invention can be practiced with modifications within the spirit and scope of the claims. Especially, mutually non-exclusive features of the embodiments described above may be combined with each other. The patentable scope of the invention is defined by the claims, and may include other examples that occur to those skilled in the art. Such other examples are intended to be within the scope of the claims.

While the foregoing is directed to embodiments of the invention, other and further embodiments of the invention may be devised without departing from the basic scope thereof, and the scope thereof is determined by the claims that follow.

The invention claimed is:

1. A focused ion beam device, comprising:
   an ion beam column adapted to house a gas field ion source emitter with an emitter tip and an emitter area for generating ions;
   a heating means adapted to heat the emitter tip;
   one or more gas inlets adapted to introduce a mixture of a first gas and at least one second gas to the emitter area, wherein the first gas and the at least one second gas are each different gases; and
   a controller adapted to switch between a first emitter tip temperature and at least a second emitter tip temperature for consecutively generating at least two different ion beams of the first gas and of the at least one second gas, wherein the first emitter tip temperature and the at least one second emitter tip temperature provide ionization of different gases of the gas mixture.

2. The focused ion beam device of claim 1, wherein the emitter tip is provided at a support comprising filaments and a filament base, wherein the heating means is adapted to heat at least one element selected from the group consisting of the emitter tip, the filaments and the filament base.

3. The focused ion beam device of claim 1, comprising:
an electrode adapted to extract ions from the gas field ion source emitter; and
a voltage supply adapted to provide a voltage between the electrode and the gas field ion source emitter.

4. The focused ion beam device of claim 3, wherein the controller is further adapted to switch between a first voltage and at least one second voltage of the voltage supply for generating an ion beam of ions of the first gas or an ion beam of ions of the at least one second gas.

5. The focused ion beam device of claim 1, wherein the first gas is a light gas which is at least one gas selected from the group consisting of a gas having an atomic mass of less than 10 g/mol, hydrogen and helium, and the at least one second gas is at least one gas selected from the group consisting of a heavy gas which has an atomic mass of 10 g/mol or higher, and a reactive gas.

6. The focused ion beam device of claim 5, wherein the heavy gas is at least one gas selected from the group consisting of a physical sputtering gas, argon, neon, and krypton, and the reactive gas is at least one gas selected from the group consisting of oxygen, hydrogen and $CO_2$.

7. The focused ion beam device of claim 1, further comprising at least one element selected from the group consisting of an objective lens adapted to focus the ion beam generated from the first gas or the at least one second gas; and a gas outlet connected to a vacuum system adapted to evacuate at least the emitter area.

8. The focused ion beam device of claim 1, further comprising:
a first valve provided within a first gas inlet of the one or more gas inlets; and
at least one second valve provided within at least one second gas inlet of the one or more gas inlets, wherein the first valve and the at least one second valve are controlled for adapting the partial pressures of the first gas and the at least one second gas.

9. A method of operating a focused ion beam device, comprising:
biasing an emitter with an emitter tip within an emitter area wherein ions are generated to a potential for providing an extraction voltage for emitting an ion beam of at least one gas of a mixture of a first gas and at least one second gas, wherein the first gas and the at least one second gas are each different gases;
consecutively heating the emitter tip to a first emitter tip temperature to emit an ion beam of the first gas of the mixture, wherein the first emitter tip temperature provides ionization of the first gas of the mixture, and
heating the emitter tip to at least one second emitter tip temperature to emit at least one ion beam of the at least one second gas of the mixture, wherein the at least one second emitter tip temperature provides ionization of the at least one second gas of the gas mixture.

10. The method of operating a focused ion beam device according to claim 9, wherein the emitter is biased to a potential for providing an extraction voltage for emitting the ion beam of the first gas.

11. The method of operating a focused ion beam device according to claim 9, wherein heating the emitter tip to the first emitter tip temperature comprises biasing the emitter to a first potential for providing an extraction voltage of the first gas.

12. The method of operating a focused ion beam device according to claim 9, wherein heating the emitter tip to the first emitter tip temperature comprises biasing the emitter to a first potential for providing an extraction voltage of the first gas, and wherein heating the emitter tip to the least one second emitter tip temperature comprises biasing the emitter to at least one second potential for providing an extraction voltage of the at least one second gas.

13. The method of operating a focused ion beam device according to claim 9, wherein heating the emitter tip to the at least one second emitter tip temperature comprises biasing the emitter to at least one second potential for providing an extraction voltage of the at least one second gas.

14. The method of operating a focused ion beam device according to claim 9, wherein the first gas is a light gas, the at least one second gas is at least one gas selected from the group consisting of a heavy inert gas and a reactive gas, the ion beam of the first gas is generated for an observation mode, an ion beam of the heavy inert gas is generated for a sputtering mode, and an ion beam of the reactive gas is generated for a reaction mode.

15. The method of operating a focused ion beam device according to claim 9, further comprising:
scanning the ion beam generated from the first gas over a specimen for an observation mode; and
detecting corpuscles released from the specimen on impingement of the ion beam generated from the first gas for observation of the specimen.

16. The method of operating a focused ion beam device according to claim 15, further comprising modifying the specimen during a modification mode, during a time when the at least one second gas is introduced in the emitter area.

17. The method of operating a focused ion beam device according to claim 16, wherein the modifying includes at least one of sputtering, reacting and etching.

18. The method of operating a focused ion beam device according to claim 9, wherein the first gas is at least one gas selected from the group consisting of a light gas, a gas having an atomic mass of less than 10 g/mol, hydrogen and helium.

19. The method of operating a focused ion beam device according to claim 9, wherein the at least one second gas is at least one gas selected from the group consisting of a heavy gas, a physical sputtering gas, a gas having an atomic mass of 10 g/mol or higher, argon, neon, krypton a reactive gas, a processing gas, oxygen, hydrogen and $CO_2$.

20. The method of operating a focused ion beam device according to claim 9, further comprising at least one of:
introducing a processing gas in the emitter area and optionally heating the emitter tip to a further emitter tip temperature;
introducing a further heavy gas into the emitter area, wherein the further heavy gas has an atomic mass of 10 g/mol or higher, and optionally heating the emitter tip to a further emitter tip temperature;
introducing hydrogen into the emitter area for an etching operation mode and optionally heating the emitter tip to a further emitter tip temperature; and
separating ions of the first gas from ions of the at least one second gas.

21. The method of operating a focused ion beam device according to claim 19, wherein the processing gas is oxygen.

22. A focused ion beam device, comprising:
an ion beam column housing an emitter with an emitter tip and an emitter area for generating ions from a mixture of a first gas and at least one second gas, wherein the first gas and the at least one second gas are each different gases; and means for switching between a first emitter tip temperature and at least one second emitter tip temperature for consecutively generating at least two different ion beams from the mixture of the first gas and of the at least one second gas, wherein the first gas is selected from the group consisting of hydrogen and helium and the at least one second gas has an atomic mass of 10 g/mol or higher.

23. A method of operating a focused ion beam device, comprising:
introducing a gas mixture of a first gas and at least one second gas to an emitter area of the focused ion beam device, wherein the first gas and the at least one second gas are each different gases; and
consecutively generating at least two different ion beams from the first gas and the at least one second gas by switching between a first emitter tip temperature and at least one second emitter tip temperature, wherein the first emitter tip temperature and the at least one second emitter tip temperature provide ionization of different gases of the gas mixture.

24. The method of claim 23, wherein the at least two different ion beams of the first gas and the at least one second gas are consecutively generated by at least one element selected from the group consisting of additionally switching between two different extraction voltages and additionally switching between at least two of the first gas and the at least second gas, the emitter tip temperatures and the extraction voltages each providing ionization of at least one of the gases.

* * * * *